(12) United States Patent
Alberti et al.

(10) Patent No.: US 8,064,045 B2
(45) Date of Patent: Nov. 22, 2011

(54) METHOD OF TRANSFERRING A SUBSTRATE, TRANSFER SYSTEM AND LITHOGRAPHIC PROJECTION APPARATUS

(75) Inventors: Jozef Augustinus Maria Alberti, Nederweert (NL); Gerardus Petrus Matthijs Van Nunen, Berghem (NL); Frans Erik Groensmit, Helmond (NL); Rene Theodorus Petrus Compen, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 295 days.

(21) Appl. No.: 12/248,284

(22) Filed: Oct. 9, 2008

(65) Prior Publication Data

US 2009/0153816 A1 Jun. 18, 2009

Related U.S. Application Data

(60) Provisional application No. 60/960,700, filed on Oct. 10, 2007.

(51) Int. Cl.
G03B 27/58 (2006.01)
G03B 27/62 (2006.01)

(52) U.S. Cl. ............................................ 355/72; 355/75
(58) Field of Classification Search .................... 355/53, 355/72–76; 378/34, 35; 396/611
See application file for complete search history.

(56) References Cited

U.S. PATENT DOCUMENTS

| | | | |
|---|---|---|---|
| 6,707,528 B1 * | 3/2004 | Aoyama et al. | 355/18 |
| 6,795,164 B2 | 9/2004 | Hoogenraad et al. | |
| 6,860,533 B2 | 3/2005 | Lee et al. | |
| 7,110,085 B2 | 9/2006 | Zaal et al. | |
| 7,139,638 B2 * | 11/2006 | Nakajima et al. | 700/218 |
| 7,374,957 B2 | 5/2008 | Oesterholt | |
| 7,564,536 B2 * | 7/2009 | Ottens et al. | 355/72 |
| 7,583,357 B2 | 9/2009 | Donders et al. | |
| 7,706,907 B2 * | 4/2010 | Hiroki | 700/114 |

(Continued)

FOREIGN PATENT DOCUMENTS

CN 1550912 A 12/2004

(Continued)

OTHER PUBLICATIONS

English Language Abstract for CN 1550912 A, published Dec. 1, 2004; 1 page.
English Language Translation of Chinese Office Action for related Chinese application No. 200810191102.0, issued on Oct. 12, 2010; 2 pages.

(Continued)

Primary Examiner — Hung Henry Nguyen
(74) Attorney, Agent, or Firm — Sterne, Kessler, Goldstein & Fox P.L.L.C.

(57) ABSTRACT

The invention relates to a method of transferring a substrate from a first substrate holder to a second substrate holder in a lithographic projection apparatus by using a transfer unit on the basis of transfer data available thereto. The second substrate holder has a surface provided with a first plurality of burls. In the method, a memory encoded with burl position data and substrate position data is provided. Subsequently, a substrate is provided on the first substrate holder. The position error and orientation of the substrate is then measured. On the basis of the burl position data, substrate position data and orientation as measured orientation adjustment data are calculated. The orientation of the substrate is subsequently adjusted in accordance with the orientation adjustment data. The substrate is then transferred from the first substrate holder to the second substrate holder by the transfer unit and placed on the second substrate holder.

10 Claims, 6 Drawing Sheets

U.S. PATENT DOCUMENTS

2006/0010710 A1*   1/2006   Park et al. .................... 34/423
2009/0180095 A1    7/2009   Alberti et al.
2010/0265488 A1   10/2010   Alberti et al.

FOREIGN PATENT DOCUMENTS

| JP | 11-330206 A   | 11/1999 |
| JP | 2001-127144 A |  5/2001 |
| JP | 2003-152053 A |  5/2003 |
| JP | 2003-168719 A |  6/2003 |
| JP | 2006-140498 A |  6/2006 |
| JP | 2007-027718 A |  2/2007 |

OTHER PUBLICATIONS

U.S. Office Action mailed on Jan. 25, 2011, directed to co-pending U.S. Appl. No. 12/248,586, filed Oct. 9, 2008; 12 pages.

English language Abstract of Japanese Patent Publication No. 11-330206 A, published Nov. 30, 1999; 1 page.

English language Abstract of Japanese Patent Publication No. 2001-127144 A, published May 11, 2001; 1 page.

English language Abstract of Japanese Patent Publication No. 2003-152053 A, published May 23, 2003; 1 page.

English language Abstract of Japanese Patent Publication No. 2003-168719 A, published Jun. 13, 2003; 1 page.

English language Abstract of Japanese Patent Publication No. 2006-140498 A, published Jun. 1, 2006; 1 page.

English language Abstract of Japanese Patent Publication No. 2007-027718 A, published Feb. 1, 2007; 1 page.

English translation of Japanese Notice of Reasons for Rejection directed to related Japanese Application No. 2008-262677, the Japanese Patent Office, mailed May 30, 2011; 3 pages.

English translation of Japanese Notice of Reasons for Rejection directed to related Japanese Application No. 2008-264460, the Japansese Patent Office, May 30, 2011; 4 pages.

U.S. Final Office Action directed to co-pending U.S. Appl. No. 12/248,586, filed Oct. 9, 2008, mailed Jul. 11, 2011; 16 pages.

Non-Final Rejection mailed Jul. 25, 2011, directed to co-pending U.S. Appl. No. 12/784,763, filed May 21, 2010; 10 pages.

* cited by examiner

METHOD OF TRANSFERRING A SUBSTRATE, TRANSFER SYSTEM AND LITHOGRAPHIC PROJECTION APPARATUS

CROSS-REFERENCE TO RELATED APPLICATION

This application claims the benefit of the filing date of U.S. Provisional Application 60/960,700 filed on Oct. 10, 2007. The subject matter of that application is incorporated herein by reference as if fully set forth herein.

BACKGROUND OF THE INVENTION

1. Field of the Invention

The present invention relates to a method of transferring a substrate from a first substrate holder to a second substrate holder in a lithographic projection apparatus. The invention further relates to a computer readable medium having computer executable code stored thereon, which when loaded on a computer assembly, enables the computer assembly to control such a method of transferring. The invention further relates to a transfer system for transferring a substrate on the basis of transfer data available thereto, a lithographic projection apparatus including such a transfer system, a device manufacturing method using such a lithographic projection apparatus, and a computer readable medium with computer executable code, which, when loaded on a computer assembly, enables the computer assembly to control such a device manufacturing method.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In device manufacturing methods using lithographic apparatus, an important factor in the yield, i.e., the percentage of correctly manufactured devices, is the accuracy within which layers are printed in relation to layers that have previously been formed.

This is known as overlay and the overlay error budget will often be 10 nm or less. To achieve such accuracy, the substrate should be aligned to the mask pattern to be transferred with great accuracy.

In order to achieve good image definition and layer overlay the irradiated surface of a substrate should be positioned accurately on supporting surface, i.e., a substrate holder, and be kept on the substrate holder as flat and as stationary as possible during exposure. Generally, for this purpose, the substrate holder is provided with a plate including a plurality of protrusions, also referred to as burls or pimples. On such a substrate holder, a substrate can be placed so that its backside is in contact with the burls, all of which lie in a well-defined plane. By connecting aperture(s) in the substrate holder to a vacuum generating device, the backside of the substrate can be clamped securely against the burls. The use of burls in this manner ensures that only a fraction of the area of the backside is actually pressed against a solid surface; in this way, the distorting effect of any particulate contamination on the backside of the wafer is minimized, since such contamination will most probably be situated in the empty spaces between burls rather than being pressed against the top surface of a burl.

However, if the substrate is fixed to the substrate table as described above, the substrate will bend over the burls. As a result, an image being exposed on the substrate will shift locally. When the substrate after development is again positioned on the substrate table for a second exposure, due to a different position with respect to burls, the local image shift will be different during the second exposure than during the first exposure. Consequently, an overlay error has been introduced.

With the continual desire to image ever smaller patterns to create device with higher component densities, there is pressure to reduce overlay errors, which leads to a desire for improved placement of a substrate on a substrate table provided with burls.

BRIEF SUMMARY OF THE INVENTION

It would be useful to provide a method of transferring a substrate and a transfer system with an improved placement accuracy than hitherto known.

To that end, the invention provides, among other things, a method of transferring a substrate from a first substrate holder to a second substrate holder in a lithographic projection apparatus by means of a transfer unit on the basis of transfer data available thereto, the second substrate holder having a surface provided with a first plurality of burls. The method includes providing a memory encoded with burl position data related to the position of the first plurality of burls on the surface of the second substrate holder and substrate position data related to a position and orientation of the substrate with respect to a second plurality of burls provided on a surface of a third substrate holder used in an earlier process step performed on the substrate. The substrate is provided on the first substrate holder. A position error is measured and an orientation of the substrate is provided on the first substrate holder. Orientation adjustment data is calculated on the basis of the burl position data, the substrate position data and the orientation as measured. The orientation of the substrate is adjusted in accordance with the orientation adjustment data as calculated. The substrate is transferred by means of the transfer unit from the first substrate holder to the second substrate holder in accordance with the transfer data and placing the substrate on the second substrate holder.

In an embodiment, the invention provides a computer readable medium having executable code stored thereon, which, when loaded on a computer assembly, enables the computer assembly to control a method of transferring as described above.

Additionally, in an embodiment, the invention provides a transfer system for transferring a substrate on the basis of transfer data available thereto. The transfer system includes a first substrate holder provided with a surface configured to hold the substrate. A sensor is configured to determine a position error and an orientation of the substrate when provided on the first substrate holder. A second substrate holder has a surface provided with a first plurality of burls, the surface being configured to hold the substrate. A memory is encoded with burl position data related to the position of the first plurality of burls on the surface of the second substrate holder and substrate position data related to a position and orientation of the substrate with respect to a second plurality of burls provided on a surface of a third substrate holder used in an earlier process step performed on the substrate. A processor communicates with the sensor and the memory, the processor being configured to calculate orientation adjustment data on the basis of the burl position data, the substrate position data and the orientation as determined. An orientation adjustment unit is configured to adjust the orientation of the substrate on the first substrate holder in accordance with the orientation adjustment data as calculated with the processor. A transfer unit is configured to transfer the substrate from the first substrate holder to the second substrate holder in accordance with the transfer data.

In an embodiment, the invention provides a lithographic projection apparatus including an illumination system configured to provide a beam of radiation. A support structure is configured to support a patterning device that serves to impart the beam of radiation with a pattern in its cross-section. A substrate table is configured to hold a substrate. A projection system is configured to expose the patterned beam on the substrate. The lithographic apparatus further includes a transfer system as described above, and the substrate table is the second substrate holder of the transfer system.

In an embodiment, the invention provides a device manufacturing method including projecting a patterned beam of radiation onto a substrate using a lithographic projection apparatus as described above.

In an embodiment, the invention provides a computer readable medium having computer executable code stored thereon, which, when loaded on a computer assembly, enables the computer assembly to control a device manufacturing method as described above.

BRIEF DESCRIPTION OF THE DRAWINGS/FIGURES

Embodiments of the invention will now be described, by way of example only, with reference to the accompanying schematic drawings in which corresponding reference symbols indicate corresponding parts, and in which.

DETAILED DESCRIPTION OF THE INVENTION

Figure 1:
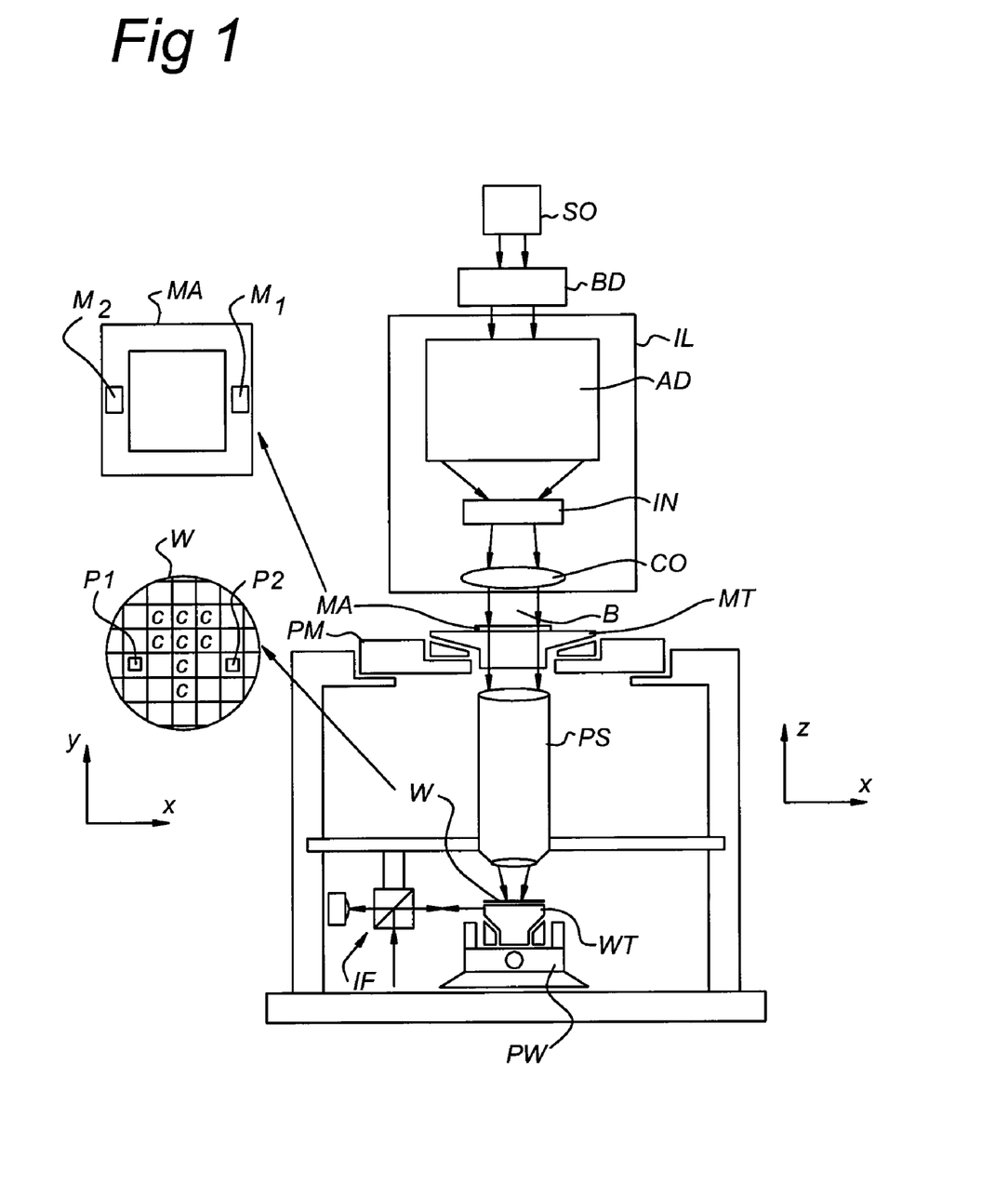
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or EUV-radiation), a support structure (e.g. a mask table) MT constructed to support a patterning device (e.g. a mask) MA and connected to a first positioner PM configured to accurately position the patterning device in accordance with certain parameters, a substrate holder, e.g. a substrate table (e.g. a wafer table) WT, constructed to hold a substrate (e.g. a resist-coated wafer) W and connected to a second positioner PW configured to accurately position the substrate in accordance with certain parameters, and a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is-reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
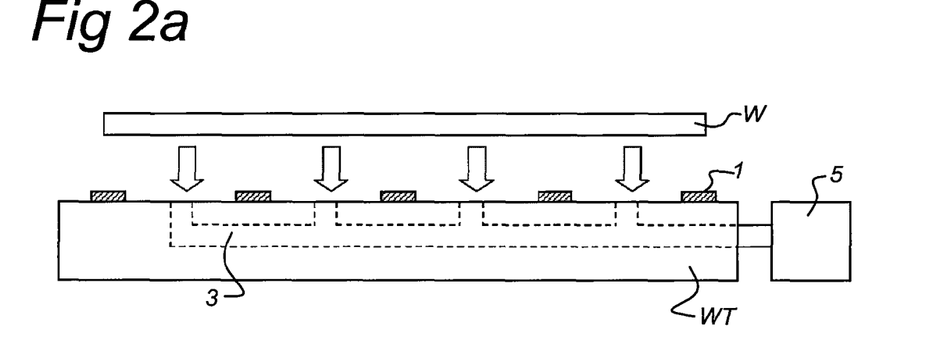
FIGS. 2a-2c schematically depict placement of a substrate on a substrate table.
Figure 2B:
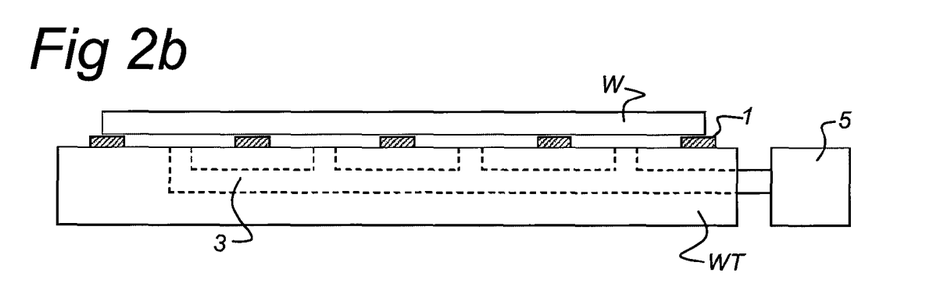
Figure 2C:
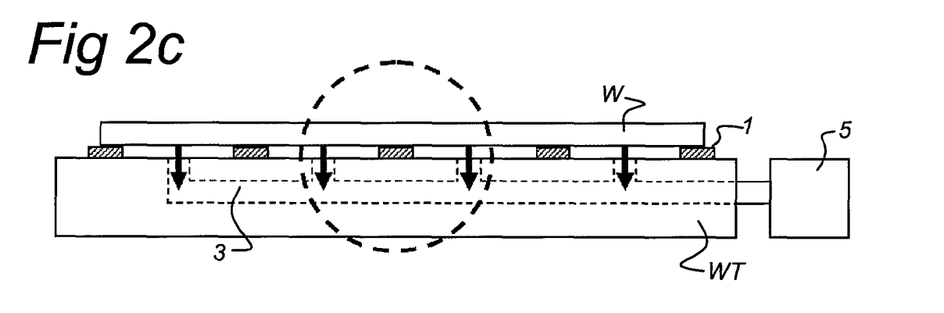

FIGS. 2a-2c schematically depict placement of a substrate on a substrate table as known in the art. The substrate table WT is provided with a plurality of protrusions, also referred to as pimples or burls 1. In this document, the expression burl will be used.

As is shown in FIG. 2a, the substrate W is moved towards the substrate table WT until the substrate makes contact with the plurality of burls provided on the surface of the substrate table.

The substrate W now rests on the substrate table WT, its backside being in contact with the plurality of burls 1 on the surface of the substrate table WT, a situation which is schematically depicted in FIG. 2b.

At this stage, air may be sucked away from spaces between the plurality of burls by connecting apertures 3 in the substrate table WT to a vacuum generating device 5. The suction of air is schematically depicted in FIG. 2c by the arrows.

Figure 2D:
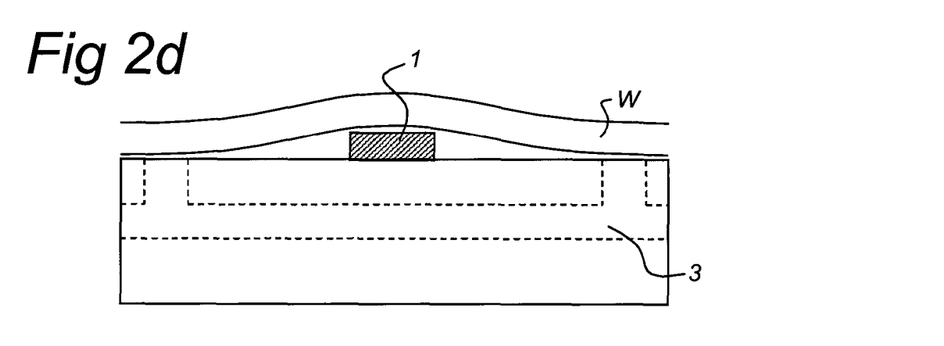
FIG. 2d schematically depicts a detail of a substrate placed on a substrate table as shown in FIG. 2c.

FIG. 2d schematically depicts a detail, i.e., shown in the dashed circle of FIG. 2c, of a substrate W placed on a substrate table WT. Due to the vacuum between the substrate W and the substrate table WT, and the uneven surface of the substrate table WT due to the plurality of burls 1, the substrate W is locally deformed. As a result, an image being exposed on the substrate W will shift locally with respect to the desired image. When the substrate W after development is again positioned on the substrate table WT for a second exposure, due to a different position with respect to the plurality of burls 1, the local image shift will be different during the second exposure than during the first exposure. Consequently, an overlay error has been introduced.

Figure 3:
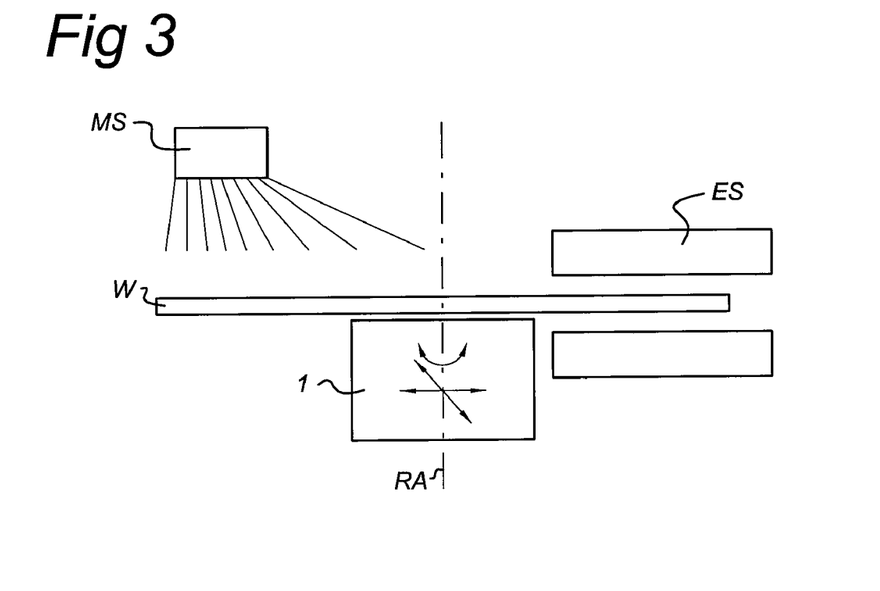
FIG. 3 schematically depicts a pre-alignment assembly that may be used in a transfer system according to an embodiment of the present invention.

FIG. 3 schematically depicts a pre-alignment assembly that may be used in a transfer system according to an embodiment of the invention. The pre-alignment assembly includes a substrate holder and a position sensor. The substrate holder is configured to rotate a substrate W about an axis RA and for translating the substrate in a plane parallel to the substrate.

The position sensor includes an eccentricity sensor ES and may further comprise a mark sensor MS. The eccentricity sensor ES is configured to determine a distance of an edge of the substrate, e.g., from the axis RA, along an axis within the plane of the substrate (hereinafter referred to as the radius). The mark sensor MS is configured to determine a location of one or more marks provided on a surface of the substrate.

When the substrate is provided on the first substrate holder, it will be at an arbitrary and unknown position on the substrate table. The eccentricity sensor ES therefore determine the position and orientation of the wafer respectively as accurate as possible. The mark sensor MS is configured to determine the position and orientation of the one or more marks on the wafer as accurate as possible. In an exemplary application, four co-ordinate systems are used in order to facilitate an accurate measurement. Two of these co-ordinate systems, i.e., an eccentricity sensor co-ordinate system ESCS and a mark sensor co-coordinate system MSCS, are fixed relative to the pre-alignment assembly. The remaining two, i.e., a geometrical substrate co-ordinate system GWCS and a substrate co-ordinate system, are fixed relative to the geometry of the substrate and the one or more marks on the substrate respectively.

Figure 4:
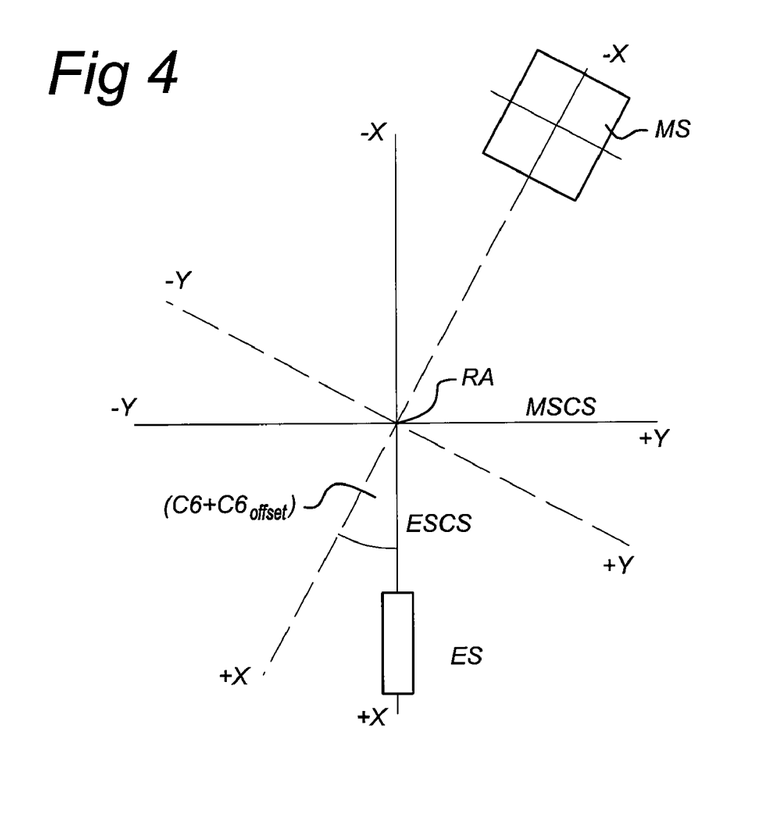
FIG. 4 schematically depicts a possible relationship between two different co-ordinate systems.

FIG. 4 schematically depicts a possible relationship between the eccentricity sensor co-ordinate system ESCS and the mark sensor co-ordinate system MSCS.

The eccentricity sensor co-ordinate system is defined by two axes, a first axis and a second axis. The first axis, i.e., X-axis, which is defined to be the line passing through the axis of rotation RA of the prealignment assembly and the pixel of the eccentricity sensor ES that is furthest from the axis of rotation RA. The second axis, i.e., Y-axis, perpendicular to the X-axis, also passes through the axis of rotation RA of the prealignment assembly. Both X-axis and Y-axis are located in the plane of the substrate when placed on the substrate holder.

The mark sensor co-ordinate system is also defined by two axes, a third axis and a fourth axis. The third axis, i.e., X'-axis corresponds to the line passing through the axis of rotation RA of the prealignment assembly and a set point on the mark sensor MS. The fourth axis, i.e., Y'-axis, is perpendicular to the X'-axis. Both X'-axis and Y'-axis are located in the plane of the substrate when placed on the substrate holder.

The mark sensor MS is arranged such that the respective axes of the eccentricity sensor co-ordinate system and the mark sensor co-ordinate system are at a predetermined angle C6, e.g., 60°. In practice, due to mounting tolerances of the eccentricity sensor ES and the mark sensor MS, there may be small offset in C6 (denoted as $C6_{offset}$). Therefore, the total angle between the axes becomes $C6+C6_{offset}$. The value of $C6_{offset}$ may be determined during calibration procedures.

Further details with respect to aforementioned co-ordinate systems and operation of the eccentricity sensor ES and the mark sensor MS may be found in U.S. Pat. No. 6,795,164.

Figure 5:
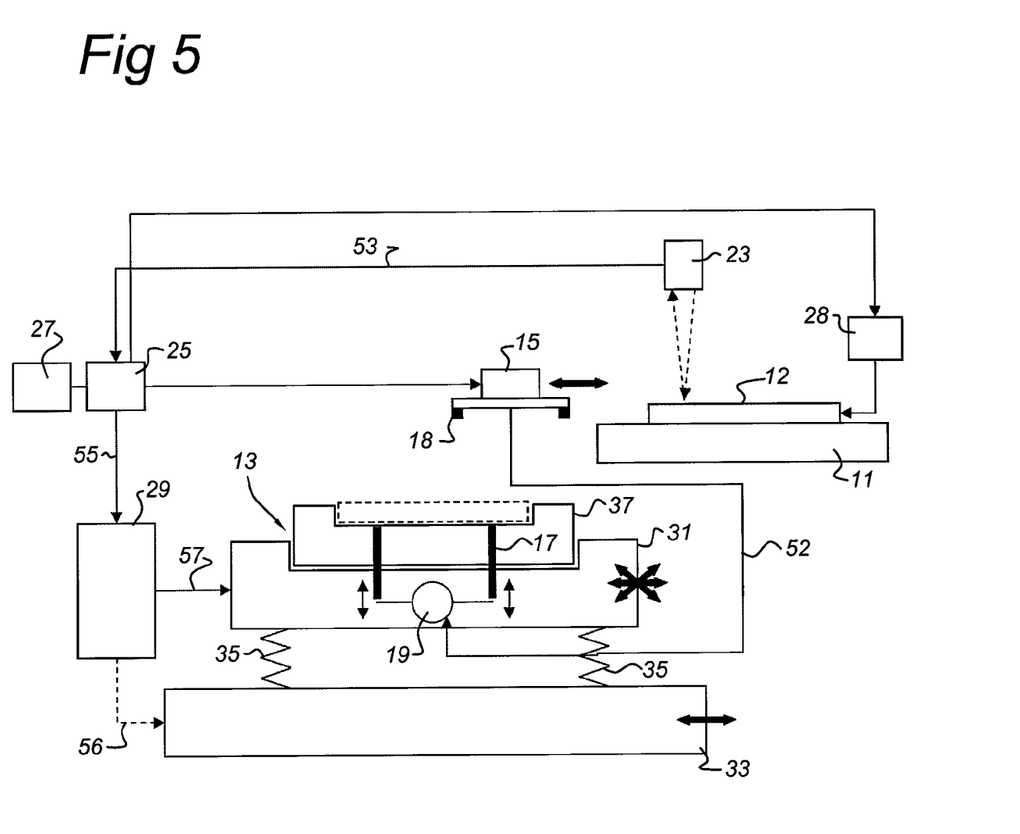
FIG. 5 schematically depicts a transfer system according to an embodiment of the invention.

FIG. 5 schematically depicts a transfer system according to an embodiment of the invention. The transfer system depicted in FIG. 5 is suitable for use in a lithographic projection apparatus. It is configured to transfer a substrate on the basis of transfer data available thereto. The transfer system includes a first substrate holder 11, a second substrate holder 13, and a transfer unit 15.

The first substrate holder 11 is configured to hold a substrate 12. In an embodiment, the first substrate holder 11 is rotatable around its center, i.e. the center of the surface on which the substrate can be held. Therefore, an axis of rotation is substantially perpendicular to aforementioned surface.

The second substrate holder 13 is also configured to hold the substrate 12 on a surface thereof. Aforementioned surface of the second substrate holder 13 is provided with a first plurality of burls.

If the transfer system is used in a lithographic projection apparatus, the second substrate holder 13 corresponds to the substrate table WT and the substrate 12 to be held corresponds to substrate W. Furthermore, the first substrate holder 11 may correspond to a substrate table used in a pre-alignment assembly, for example the pre-alignment assembly schematically depicted in FIG. 3.

The transfer unit 15 is configured to transfer the substrate 12 from the first substrate holder 11 to the second substrate holder 13. The transfer is executed in accordance with aforementioned transfer data. In the embodiment schematically depicted in FIG. 5, the transfer unit 15 includes two sub-units, i.e. a gripper unit 18 configured to pick up the substrate 12 from the first substrate holder 11 and move the substrate 12 towards the second substrate holder 15, and three or more extendable pins residing in the second substrate table 13, so-called E-pins 17. The position and movement of the E-pins 17 may be controlled by an E-pins actuator 19, e.g. a Lorentz motor, which in its turn may be controlled by local electronics. As a safety measure on power failure occurrences, the E-pins 17 may be configured to fall to their lowest position by the natural force of gravity. This may ensure that the E-pins 17 are not to be damaged. The transfer unit 15 may now be arranged to control movement of the substrate 12 held by the gripper unit 18 in cooperation with movement of the E-pins 17, the latter schematically depicted by means of arrowed line 52. The transfer unit 15 may control movement of the gripper unit 18 in a direction towards the E-pins 17, in FIG. 5 a movement to the left, such that the substrate 12 is positioned suitably above the E-pins 17. The transfer unit 15 may then control extension of the E-pins 17 towards the substrate 12, in FIG. 5 upwards, until they make contact with the substrate 12. The transfer unit 15 subsequently controls detachment of the substrate 12 from the gripper unit 18 and subsequent movement of the gripper unit 18 away from the E-pins 17, e.g., in FIG. 5 a movement to the right until the gripper unit 18 no longer blocks a movement of the substrate 12 towards the second substrate holder 13. Finally, the transfer unit 15 may control retraction of the E-pins 17 until the substrate 12 is positioned on the second substrate holder 13.

The transfer system may further comprise a measuring unit 23 including a sensor e.g., a position sensor including an eccentricity sensor ES and possibly a mark sensor MS as schematically shown in and described with reference to FIGS. 3 and 4. The transfer system further includes a processor 25 and a memory 27, the memory 27 being communicationally connected to the processor 25. The memory includes burl position data and substrate position data. Measuring unit 23 and processor 25 may communicated via a channel depicted in FIG. 5 as arrowed line 53.

The burl position data are related to the position of the first plurality of burls on the surface of the second substrate holder 13. The substrate position data are related to a position and orientation of the substrate 12 that is or is to be provided on the first substrate holder 11 with respect to a second plurality of burls provided on a surface of a third substrate holder used in an earlier process step performed on the substrate 12, e.g., an exposure step in a lithographic projection apparatus. In an embodiment, the third substrate holder is the same substrate holder as the second substrate holder 13. In another embodiment, the third substrate holder is different from the second substrate holder 13. In the latter case, the substrate 12 may be processed earlier in a different apparatus, e.g., a lithographic projection apparatus, or, alternatively, on a different substrate holder within the same apparatus, e.g., a lithographic projection apparatus provided with two substrate holders for exposure. Embodiments of the memory 27 are discussed further with reference to FIG. 7.

The processor 25 is further communicationally connected to the sensor in the measurement unit 23. In embodiments of the invention, the processor 25 is configured to calculate amended transfer data and orientation adjustment data. The processor 25 may perform calculation of the amended transfer data on the basis of the transfer data, the burl position data, the substrate position data and the position error as determined with the sensor in the measurement unit 23. The processor 25 may perform calculation of the orientation adjustment data on the basis of the burl position data, the substrate position data and the orientation as determined with the sensor in the measurement unit 23. In a transfer system as shown in FIG. 5, the processor 25 is configured to transmit aforementioned amended transfer data to the transfer unit 15 in order to enable the transfer unit 15 to control transfer and placement of the substrate in accordance with the amended transfer data. More details with respect to the functionality of the processor 25 are described with reference to FIGS. 6 and 7.

The transfer system further includes an orientation adjustment unit 28. The orientation adjustment unit 28 is configured to adjust the orientation of the substrate 12 on the first substrate holder 11 in accordance with the orientation adjustment data as calculated by the processor 25. Movement of the second substrate holder 13 may be controlled by a control unit 29, which in its turn may be communicationally connected to the processor 25. A data stream between the processor 25 and the control unit 29 is in FIG. 5 schematically depicted by arrowed line 55.

It should be understood that, although in FIG. 5 the processor 25, the transfer unit 15, and the control unit 29 are depicted as separate elements, the processor 25 may be incorporated in one of the transfer unit 15 and the control unit 29, e.g., in case the control unit 29 takes the form of a computer assembly as described with reference to FIG. 7.

Positioning of a substrate table WT in a lithographic projection apparatus is generally implemented by a so-called long-stroke stage module and a so-called short-stroke stage module, in FIG. 5 indicated by reference number 31 and 33 respectively. The combined positioning ability of theses two stage modules 31, 33 provides an accurate and fast positioning. The long-stroke stage module 33 generally provides coarse positioning and movement of the short-stroke stage module 31 in a number of directions, generally three. The short-stroke stage module 31 generally provides accurate movement and positioning of a substrate W placed thereon in six degrees of freedom. The short-stroke stage module 31 may be separated from the long-stroke stage module 33 by means of air bearings 35 and may be driven by one or more Lorentz motors (not shown).

The control unit 29 may comprise separate control modules to control movement and positioning of the short-stroke stage module 29 and the long-stroke stage module 33 separately. Alternatively, the same control unit 29 may be configured to control movement and positioning of both the long-stroke stage module 31 and the short-stroke stage module 33, this situation being depicted in FIG. 5 by arrowed lines 56 and 57, respectively.

As schematically depicted in FIG. 5, the second substrate table 13 may not only include a short-stroke stage module 31, but also an additional element 37. The additional element 37 may be provided with a recess area sufficiently large to accommodate the substrate 12. The surface of the recess is then provided with aforementioned first plurality of burls and further provided with apertures between the first plurality of burls for the purpose of establishing a vacuum environment as discussed with reference to FIGS. 2a-d. In immersion lithographic projection apparatus, the recess in the additional element 37 may also have the purpose of containing and controlling immersion fluid.

Figure 6:
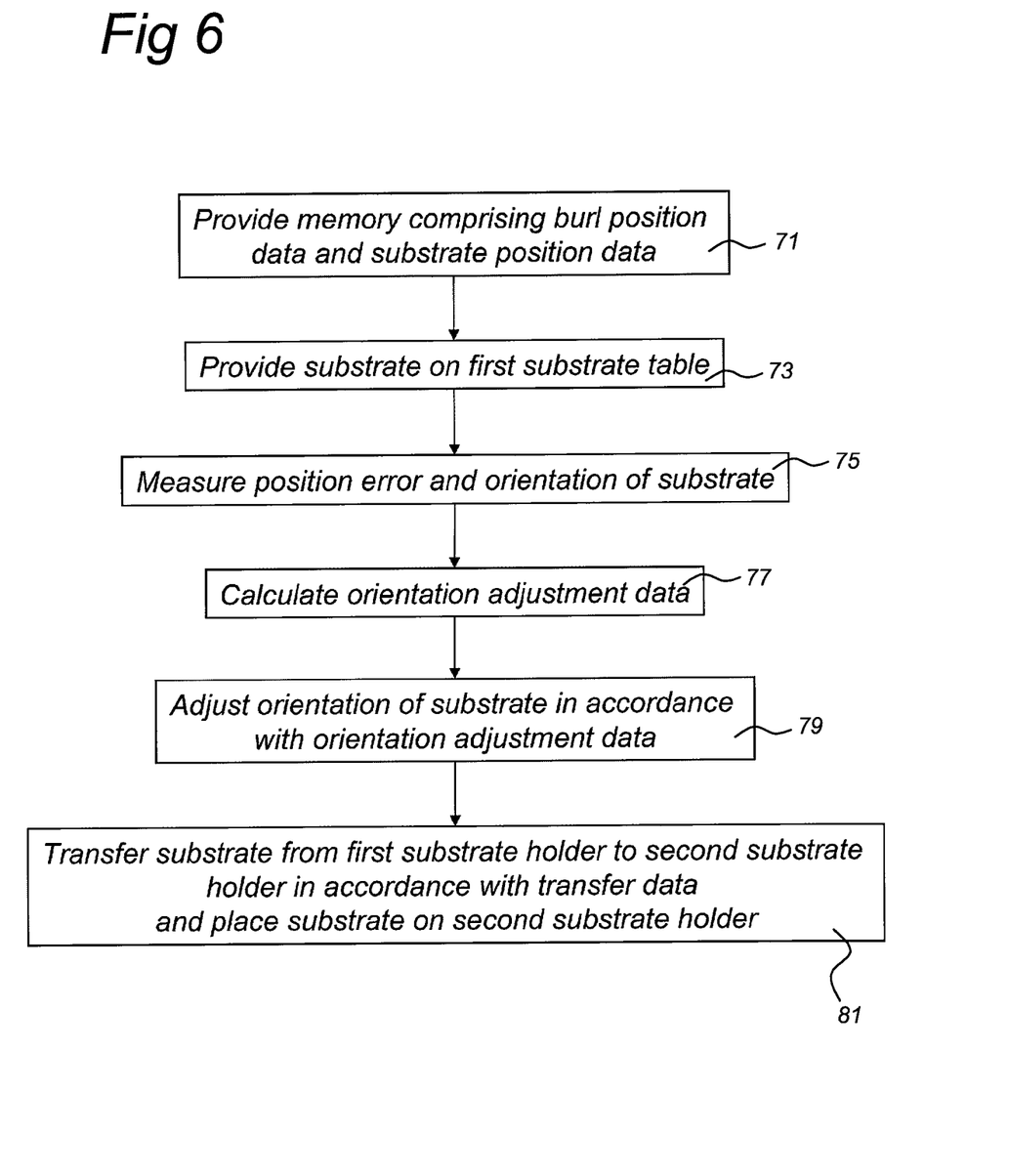
FIG. 6 schematically depicts a method of transferring a substrate from a first substrate holder to a second substrate holder according to an embodiment of the invention.

FIG. 6 schematically depicts a method of transferring a substrate from a first substrate holder to a second substrate holder according to an embodiment of the invention. The second substrate holder includes a surface provided with a first plurality of burls as explained earlier with reference to FIG. 5. The transfer is performed by a transfer unit on the basis of transfer data available thereto.

First, in action 71, a memory is provided. The memory includes burl position data and substrate position data. Further details with respect to burl position data and substrate position data were described earlier with reference to FIG. 5.

Additionally, in action 73, the substrate is provided on the first substrate holder.

Then, in action 75, a position error and orientation of the substrate is measured. The measurement of the position error may be performed by a sensor, e.g., a position sensor as schematically depicted in and described with reference to FIGS. 3 and 4.

Subsequently, in action 77, orientation adjustment data are calculated. The orientation adjustment data are calculated by the processor on the basis of the burl position data and substrate position data obtained from the memory provided in action 71, and the orientation as measured in action 75.

Subsequently, in action 79, the orientation of the substrate is adjusted in accordance with the orientation adjustment data.

Finally, in action 81, the substrate is transferred from the first substrate holder to the second substrate holder in accordance with the transfer data and placed on the second substrate holder.

Figure 7:
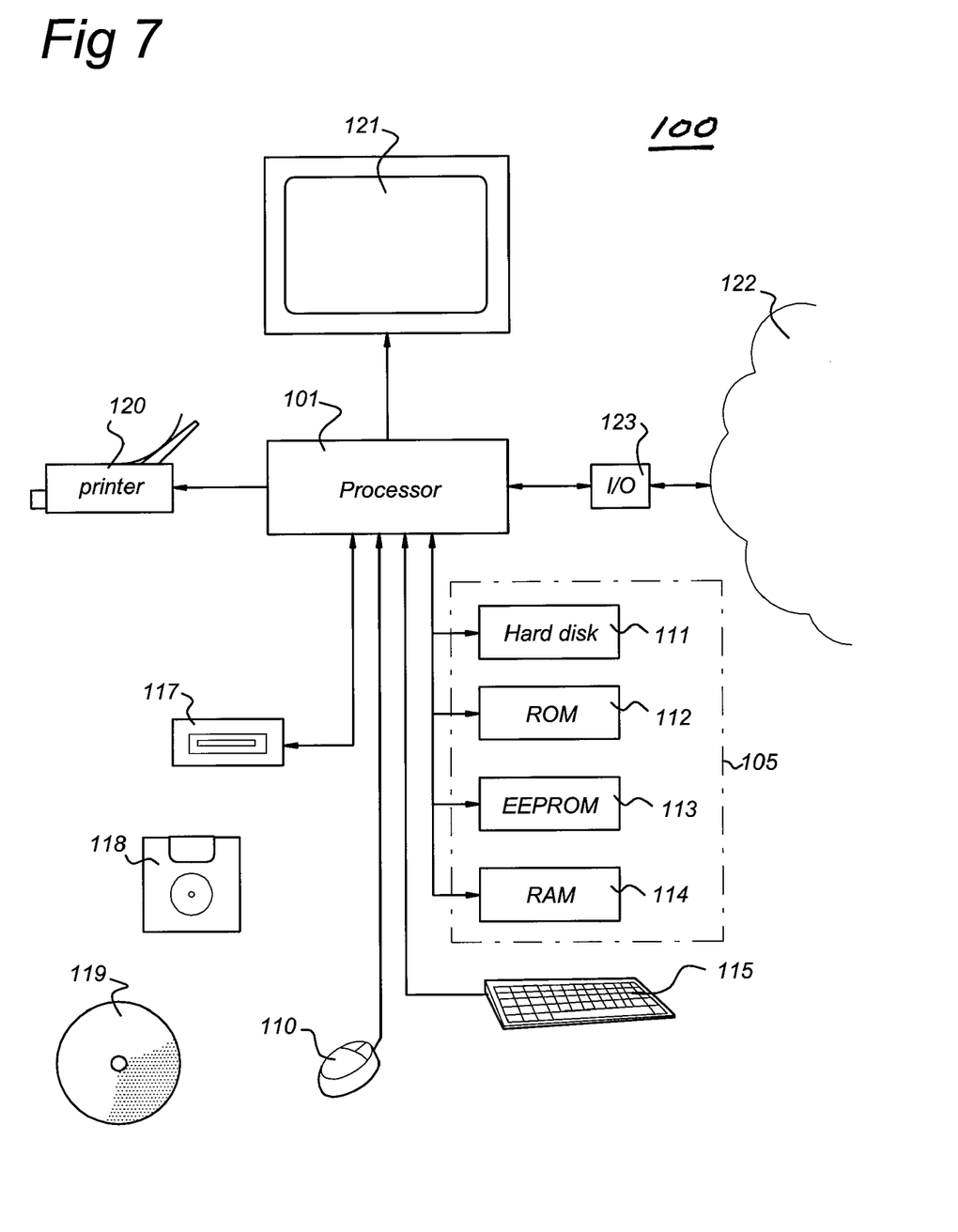
FIG. 7 schematically depicts an embodiment of a computer assembly that may be used in embodiments of the invention.

FIG. 7 schematically depicts an embodiment of a computer assembly that may be used in embodiments of the present invention. Such a computer assembly 100 may be a dedicated computer in the form of a control unit, e.g., control unit 29. The computer assembly 100 may be arranged for loading a computer readable medium including computer executable code. This may enable the computer assembly 100 to execute, when the computer executable code on the computer readable medium is loaded, embodiments of aforementioned method of transferring a substrate from a first substrate holder to a second substrate holder by means of a transfer unit on the basis of transfer data available thereto Additionally or alternatively, this may enable the computer assembly 100 to execute, when the computer readable medium is loaded, a device manufacturing method in which a target portion of a substrate is patterned by means of embodiments of a lithographic projection apparatus including such a transfer system.

The computer assembly 100 includes a processor 101, e.g. processor 25 in communication with control unit 29, and a may further comprise a memory 105, e.g. memory 27. The memory 105, which is connected to processor 101, may comprise a number of memory components like a hard disk 111, Read Only Memory (ROM) 112, Electrically Erasable Programmable Read Only Memory (EEPROM) 113 and Random Access Memory (RAM) 114. Not all aforementioned memory components need to be present. Furthermore, it is not essential that aforementioned memory components are physically in close proximity to the processor 101 or to each other. They may be located at a distance away The processor 101 may also be connected to some kind of user interface, for instance a keyboard 115 or a mouse 110. A touch screen, track ball, speech converter or other interfaces that are known to persons skilled in the art may also be used.

The processor 101 may be connected to a reading unit 117, which is arranged to read data, e.g. in the form of computer executable code, from and under some circumstances store data on a computer readable medium, like a floppy disc 118 or a CDROM 119. Also DVDs or other computer readable media known to persons skilled in the art may be used.

The processor 101 may also be connected to a printer 120 to print out output data on paper as well as to a display 121, for example a monitor or LCD (Liquid Crystal Display), of any other type of display known to a person skilled in the art.

The processor 101 may be connected to a communications network 122, for instance a public switched telephone network (PSTN), a local area network (LAN), a wide area network (WAN) etc. by means of transmitters/receivers responsible for input/output (I/O) 123. The processor 101 may be arranged to communicate with other communication systems via the communications network 122. In an embodiment of the invention external computers (not shown), for instance personal computers of operators, can log into the processor 101 via the communications network 122.

The processor 101 may be implemented as an independent system or as a number of processing units that operate in parallel, wherein each processing unit is arranged to execute sub-tasks of a larger program. The processing units may also be divided in one or more main processing units with several subprocessing units. Some processing units of the processor 101 may even be located a distance away of the other processing units and communicate via communications network 122.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled person will appreciate that, in the context of such alternative applications, any use of the terms "wafer" or "die" herein may be considered as synonymous with the more general terms "substrate" and "target portion", respectively. The substrate referred to herein may be processed before or after exposure, in for example a track (a tool that typically applies a layer of resist to a substrate and develops the exposed resist), a metrology tool and/or an inspection tool. where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 355, 248, 193, 157 or 126 nm).

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method of transferring a substrate from a first substrate holder to a second substrate holder in a lithographic projection apparatus using a transfer unit based on transfer data available thereto, said second substrate holder having a surface provided with a first plurality of burls, the method comprising:

providing a memory encoded with burl position data related to the position of said first plurality of burls on the surface of said second substrate holder and substrate position data related to a position and orientation of said substrate with respect to a second plurality of burls provided on a surface of a third substrate holder used in an earlier process step performed on said substrate;

providing said substrate on said first substrate holder;

measuring a position error and an orientation of said substrate provided on said first substrate holder;

calculating orientation adjustment data based on said burl position data, said substrate position data and said orientation as measured;

adjusting the orientation of said substrate in accordance with said orientation adjustment data as calculated; and transferring said substrate using said transfer unit from the first substrate holder to the second substrate holder in accordance with said transfer data and placing said substrate on said second substrate holder.

2. The method according to claim 1, wherein the position error is an eccentricity error measured by an eccentricity sensor.

3. A non-transitory computer readable medium having computer executable code stored thereon, which, when loaded on a computer assembly, enables the computer assembly to control a method of transferring a substrate from a first substrate holder to a second substrate holder in a lithographic projection apparatus using a transfer unit based on transfer data available thereto, said second substrate holder having a surface provided with a first plurality of burls, the method comprising:

providing a memory encoded with burl position data related to the position of said first plurality of burls on the surface of said second substrate holder and substrate position data related to a position and orientation of said substrate with respect to a second plurality of burls provided on a surface of a third substrate holder used in an earlier process step performed on said substrate;

providing said substrate on said first substrate holder;

measuring a position error and an orientation of said substrate provided on said first substrate holder;

calculating orientation adjustment data based on said burl position data, said substrate position data and said orientation as measured;

adjusting the orientation of said substrate in accordance with said orientation adjustment data as calculated; and transferring said substrate using said transfer unit from the first substrate holder to the second substrate holder in accordance with said transfer data and placing said substrate on said second substrate holder.

4. The non-transitory computer readable medium according to claim 3 wherein the position error is an eccentricity error measured by an eccentricity sensor.

5. A transfer system for transferring a substrate based on transfer data available thereto, the transfer system comprising:

a first substrate holder provided with a surface configured to hold said substrate;

a sensor configured to determine a position error and an orientation of said substrate when provided on said first substrate holder; a second substrate holder comprising a surface provided with a first plurality of burls, said surface being configured to hold said substrate;

a memory encoded with burl position data related to the position of said first plurality of burls on the surface of said second substrate holder and substrate position data related to a position and orientation of said substrate with respect to a second plurality of burls provided on a surface of a third substrate holder used in an earlier process step performed on said substrate;

a processor communicated to said sensor, and said memory, the processor being configured to calculate orientation adjustment data on the basis of said burl position data, said substrate position data and said orientation as determined;

an orientation adjustment unit configured to adjust the orientation of said substrate on said first substrate holder in accordance with the orientation adjustment data as calculated with said processor; and a transfer unit configured to transfer said substrate from said first substrate holder to said second substrate holder in accordance with the transfer data.

6. The transfer system according to claim 5, wherein the transfer system further comprises a further sensor configured to determine a position error and an orientation of one or more marks provided on said substrate when provided on said first substrate holder.

7. The transfer system according to claim 5, wherein said transfer unit comprises at least three extendable pins located in said further substrate table.

8. The transfer system according to claim 6, wherein said transfer unit comprises at least three extendable pins located in said further substrate table.

9. The transfer system according to claim 7, wherein said transfer system further comprises an actuator configured to control extension of said at least three extendable pins.

10. The transfer system according to claim 8, wherein said transfer system further comprises an actuator configured to control extension of said at least three extendable pins.

\* \* \* \* \*